(12) United States Patent
Yang

(10) Patent No.: US 11,997,883 B2
(45) Date of Patent: May 28, 2024

(54) ORGANIC LIGHT EMITTING DIODE DISPLAY DEVICE

(71) Applicant: BOE TECHNOLOGY GROUP CO., LTD., Beijing (CN)

(72) Inventor: Wei Yang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/870,040

(22) Filed: Jul. 21, 2022

(65) Prior Publication Data

US 2022/0359636 A1 Nov. 10, 2022

Related U.S. Application Data

(63) Continuation of application No. 16/471,911, filed as application No. PCT/CN2018/115691 on Nov. 15, 2018, now Pat. No. 11,430,844.

(30) Foreign Application Priority Data

Apr. 11, 2018 (CN) .......................... 201810336384.2

(51) Int. Cl.
*H01L 27/32* (2006.01)
*H01L 51/00* (2006.01)
(Continued)

(52) U.S. Cl.
CPC ....... *H10K 59/1213* (2023.02); *H10K 77/111* (2023.02); *H01L 27/1218* (2013.01);
(Continued)

(58) Field of Classification Search
CPC .. H10K 59/1213; H10K 77/111; H10K 59/12; H10K 2102/311; H10K 2102/3026;
(Continued)

(56) References Cited

U.S. PATENT DOCUMENTS 9,147,719 B2 9/2015 Kim et al.
9,911,762 B2 3/2018 Yan et al.
(Continued)

FOREIGN PATENT DOCUMENTS

CN 106920801 A 7/2017
CN 107403806 A 11/2017
(Continued)

OTHER PUBLICATIONS

Non-final Office Action of U.S. Appl. No. 16/471,911.
International Search Report of PCT/CN2018/115691 in Chinese & English.

*Primary Examiner* — Nikolay K Yushin
(74) *Attorney, Agent, or Firm* — Chiwin Law LLC

(57) ABSTRACT

An organic light emitting diode display device are provided. The organic light emitting diode display device includes: a substrate; a barrier layer, located on a side of the substrate; a first buffer layer, located on a side of the barrier layer; a first semiconductor layer, located on a side of the first buffer layer; a first gate insulating layer, located on a side of the first semiconductor layer; a first gate electrode, located on a side of the first gate insulating layer; a second buffer layer, located on a side of the first gate electrode; a second semiconductor layer, located on a side of the second buffer layer; a second gate insulating layer, located on a side of the second semiconductor layer; a second gate electrode, located on a side of the second gate insulating layer.

14 Claims, 6 Drawing Sheets

(51) Int. Cl.
  *H10K 59/121* (2023.01)
  *H10K 77/10* (2023.01)
  *H01L 27/12* (2006.01)
  *H01L 29/66* (2006.01)
  *H01L 29/786* (2006.01)
  *H10K 59/12* (2023.01)
  *H10K 102/00* (2023.01)

(52) U.S. Cl.
  CPC ...... *H01L 27/1225* (2013.01); *H01L 27/1251* (2013.01); *H01L 27/1262* (2013.01); *H01L 27/127* (2013.01); *H01L 29/66757* (2013.01); *H01L 29/66969* (2013.01); *H01L 29/78675* (2013.01); *H01L 29/7869* (2013.01); *H10K 59/1201* (2023.02); *H10K 2102/311* (2023.02)

(58) Field of Classification Search
  CPC ............. H10K 59/121; H10K 59/1216; H10K 59/126; H10K 59/1201; H10K 59/12; H10K 59/123; H10K 71/00; H10K 71/191; H10K 71/20; H10K 71/60; H01L 27/1218; H01L 27/1225; H01L 27/1251; H01L 27/1262; H01L 27/127; H01L 29/66757; H01L 29/66969; H01L 29/78675; H01L 29/7869; H01L 27/12; H01L 27/1255; H01L 27/124; H01L 29/66; H01L 29/78633; H01L 29/786; H01L 29/41733

See application file for complete search history.

(56) References Cited

U.S. PATENT DOCUMENTS

| | | | |
|---|---|---|---|
| 11,515,376 B2* | 11/2022 | Cho | ..................... H10K 59/124 |
| 2015/0123084 A1 | 5/2015 | Kim et al. | |
| 2017/0162606 A1 | 6/2017 | Yan et al. | |
| 2017/0338249 A1 | 11/2017 | Suzumura et al. | |
| 2018/0076239 A1 | 3/2018 | Suzumura et al. | |
| 2018/0219032 A1 | 8/2018 | Lou et al. | |
| 2021/0036082 A1* | 2/2021 | Cho | ..................... H01L 27/1251 |

FOREIGN PATENT DOCUMENTS

| | | |
|---|---|---|
| CN | 107452757 A | 12/2017 |
| CN | 108493198 A | 9/2018 |

* cited by examiner

S101 — forming a first thin film transistor including a first semiconductor pattern on a substrate, forming the first thin film transistor comprising forming a first electrode pattern including a first source electrode and a first drain electrode and a second electrode pattern including a first auxiliary source electrode and a first auxiliary drain electrode through two patterning processes, respectively S102 — forming a second thin film transistor on the substrate, forming the second thin film transistor comprising forming a second source electrode and a second drain electrode through one patterning process, wherein the second electrode pattern, the second source electrode and the second drain electrode are formed in the same patterning process, the first electrode pattern is connected with the first semiconductor pattern, the first auxiliary source electrode is electrically connected with the first source electrode, and the first auxiliary drain electrode is electrically connected with the first drain electrode

Fig. 2

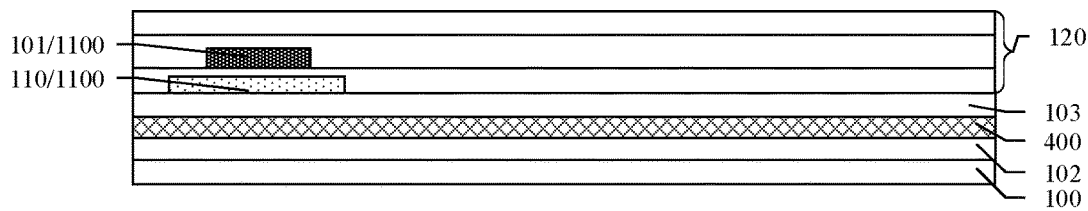

Fig. 3A

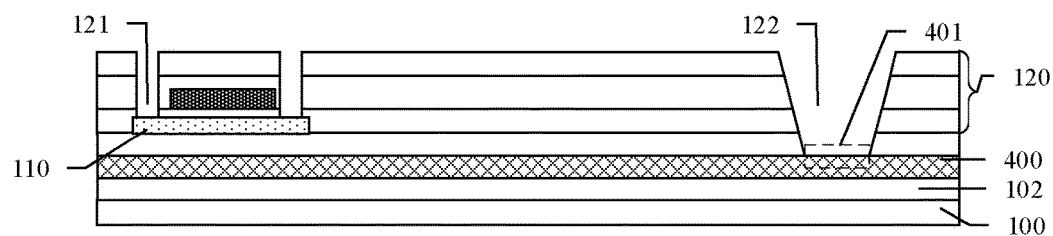

ORGANIC LIGHT EMITTING DIODE DISPLAY DEVICE

This application is a continuation of U.S. patent application Ser. No. 16/471,911 filed on Jun. 20, 2019, which is a U.S. National Phase Entry of International Application No. PCT/CN2018/115691 filed Nov. 15, 2018, which claims priority to and the benefit of Chinese patent application No. 201810336384.2 filed on Apr. 11, 2018. The above-identified applications are incorporated by reference herein in their entirety.

TECHNICAL FIELD

At least one embodiment of the present disclosure relates to an organic light emitting diode display device.

BACKGROUND

In the display industry, display devices using low temperature polysilicon (LTPS) and metal Oxide (OXIDE) as materials of active layers of thin film transistors have attracted much attention. Thin film transistors made of low-temperature polysilicon have the advantages of high mobility and fast charging, while thin film transistors made of metal oxide materials have the advantage of low leakage current. If the advantages of the two materials are combined to form a display device, the user experience of the display device will be greatly improved.

SUMMARY

At least one embodiment provides organic light emitting diode display device comprising: a barrier layer, located on a side of the substrate; a first buffer layer, located on a side of the barrier layer away from the substrate; a first semiconductor layer, located on a side of the first buffer layer away from the substrate; a first gate insulating layer, located on a side of the first semiconductor layer away from the substrate; a first gate electrode, located on a side of the first gate insulating layer away from the substrate;
a second buffer layer, located on a side of the first gate electrode away from the substrate; a second semiconductor layer, located on a side of the second buffer layer away from the substrate; a second gate insulating layer, located on a side of the second semiconductor layer away from the substrate; a second gate electrode, located on a side of the second gate insulating layer away from the substrate. A material of the first semiconductor pattern is different from that of the second semiconductor pattern.

For example, in the organic light emitting diode display according to an embodiment of the disclosure, the organic light emitting diode display further comprises: a first electrode pattern, connected with the first semiconductor layer, and a second electrode pattern, connected with the first electrode pattern. The first electrode pattern comprises a first source electrode and a first drain electrode, the second electrode pattern comprises a first auxiliary source electrode and a first auxiliary drain electrode, the first auxiliary source electrode is electrically connected with the first source electrode, and the first auxiliary drain electrode is electrically connected with the first drain electrode.

For example, in the organic light emitting diode display according to an embodiment of the disclosure, the organic light emitting diode display further comprises a first metal pattern, wherein the first metal pattern is located on a side of the second buffer layer away from the substrate and a side of the second gate insulating layer close to the substrate.

For example, in the organic light emitting diode display according to an embodiment of the disclosure, the first metal pattern is located in a same layer as the second semiconductor layer.

For example, in the organic light emitting diode display according to an embodiment of the disclosure, the material of the first semiconductor pattern comprises polysilicon and the material of the second semiconductor pattern comprises metal oxide.

For example, the organic light emitting diode display according to an embodiment of the disclosure, the metal oxide comprises indium gallium zinc oxide (IGZO).

For example, the organic light emitting diode display according to an embodiment of the disclosure, the organic light emitting diode display further comprises: an interlayer dielectric layer, located on a side of the second gate electrode away from the substrate.

For example, the organic light emitting diode display according to an embodiment of the disclosure, a thickness of the second gate insulating layer in a direction perpendicular to the substrate is 1000-1500 angstroms.

For example, the organic light emitting diode display according to an embodiment of the disclosure, an orthographic projection of the second gate electrode on the substrate overlaps with an orthographic projection of the first metal pattern on the substrate, and a distance between the first metal pattern and the second gate electrode is 1000-1500 angstroms.

For example, the organic light emitting diode display according to an embodiment of the disclosure, the distance between the first metal pattern and the second gate electrode is 1300-1400 angstroms At least one embodiment of the disclosure provides an organic light emitting diode display device comprising: a substrate; a barrier layer, located on a side of the substrate; a first buffer layer, located on a side of the barrier layer away from the substrate; a first semiconductor layer, located on a side of the first buffer layer away from the substrate; a first gate insulating layer, located on a side of the first semiconductor layer away from the substrate; a first gate electrode, located on a side of the first gate insulating layer away from the substrate; a second buffer layer, located on a side of the first gate electrode away from the substrate; a second semiconductor layer, located on a side of the second buffer layer away from the substrate; a second gate insulating layer, located on a side of the second semiconductor layer away from the substrate; a second gate electrode, located on a side of the second gate insulating layer away from the substrate. A material of the first semiconductor pattern is different from that of the second semiconductor pattern, and the first gate electrode directly contacts with the first gate insulating layer For example, the organic light emitting diode display according to an embodiment of the disclosure, a thickness of the second gate insulating layer in a direction perpendicular to the substrate is 1000-1500 angstroms.

For example, the organic light emitting diode display according to an embodiment of the disclosure, the first semiconductor layer directly contacts with the first buffer layer, and the second semiconductor layer directly contacts with the second buffer layer.

For example, the organic light emitting diode display according to an embodiment of the disclosure, the organic light emitting diode display further comprises comprising a first metal pattern, wherein the first metal pattern is located on a side of the second buffer layer away from the substrate and a side of the second gate insulating layer close to the substrate.

For example, the organic light emitting diode display according to an embodiment of the disclosure, the first metal pattern is located in a same layer as the second semiconductor layer.

At least one embodiment of the disclosure provides an organic light emitting diode display device comprising a substrate; a barrier layer, located on a side of the substrate; a first buffer layer, located on a side of the barrier layer away from the substrate; a first semiconductor layer, located on a side of the first buffer layer away from the substrate; a first gate insulating layer, located on a side of the first semiconductor layer away from the substrate; a first gate electrode, located on a side of the first gate insulating layer away from the substrate; a second buffer layer, located on a side of the first gate electrode away from the substrate; a second semiconductor layer, located on a side of the second buffer layer away from the substrate; a second gate insulating layer, located on a side of the second semiconductor layer away from the substrate; a second gate electrode, located on a side of the second gate insulating layer away from the substrate. A material of the first semiconductor pattern is different from that of the second semiconductor pattern, the organic light emitting diode display device has a display area and a peripheral area, a bending region is provided on a side of the second gate electrode away from the substrate, a metal trace is provided in the bending region, and the metal tracing is configured to connect a trace of the display area to the peripheral area.

For example, the organic light emitting diode display according to an embodiment of the disclosure, a thickness of the second gate insulating layer in a direction perpendicular to the substrate is 1000-1500 angstroms.

For example, the organic light emitting diode display according to an embodiment of the disclosure, the organic light emitting diode display further comprises: a first electrode pattern, connected with the first semiconductor layer, and a second electrode pattern, connected with the first electrode pattern. The first electrode pattern comprises a first source electrode and a first drain electrode, the second electrode pattern comprises a first auxiliary source electrode and a first auxiliary drain electrode, the first auxiliary source electrode is electrically connected with the first source electrode, and the first auxiliary drain electrode is electrically connected with the first drain electrode.

For example, the organic light emitting diode display according to an embodiment of the disclosure, the organic light emitting diode display further comprises a second auxiliary source electrode and a second auxiliary drain electrode, wherein the second auxiliary source electrode and the second auxiliary drain electrode are electrically connected to the first auxiliary source electrode and the first auxiliary drain electrode, respectively.

For example, the organic light emitting diode display according to an embodiment of the disclosure, the second auxiliary source electrode, the second auxiliary drain electrode and the metal trace are located in a same trace and comprise a same material.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

FIG. 2 is a schematic flow chart of a manufacturing method of an array substrate according to an embodiment of the present disclosure;

FIGS. 3A-3L are schematic views of a process flow for preparing an array substrate according to an embodiment of the present disclosure.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise specified, the technical terms or scientific terms used in the disclosure have normal meanings understood by those skilled in the art. The words "first", "second" and the like used in the disclosure do not indicate the sequence, the number or the importance but are only used for distinguishing different components. The word "comprise", "include" or the like only indicates that an element or a component before the word contains elements or components listed after the word and equivalents thereof, not excluding other elements or components. The words "on", "beneath", "left", "right" and the like only indicate the relative position relationship which is correspondingly changed when the absolute position of a described object is changed.

In the research, the inventor of the application found that: the preparation process of the thin film transistor using the low-temperature polysilicon material is quite different from the preparation process of the thin film transistor using the metal oxide material. On one hand, the two have the problem of difficult process compatibility, and the process stability is difficult to be ensured; on the other hand, the number of mask plates required to form a display device (LTPO display device) by combining a thin film transistor using low-temperature polysilicon material (LTPS) with a thin film transistor using metal Oxide material (OXIDE) is large and the cost is high.

In addition, with the development of display technology, full-screen frame-free display products using bending technology (such as pad bending technology) and double SD technology have better market prospects. The difficulty in forming a full-screen frame-free display product by combining a thin film transistor made of low-temperature polysilicon (LTPS) and a thin film transistor made of metal Oxide lies in the need to control the process and ensure the characteristics of the thin film transistor made of low-temperature polysilicon and the thin film transistor made of metal oxide.

Figure 1A:
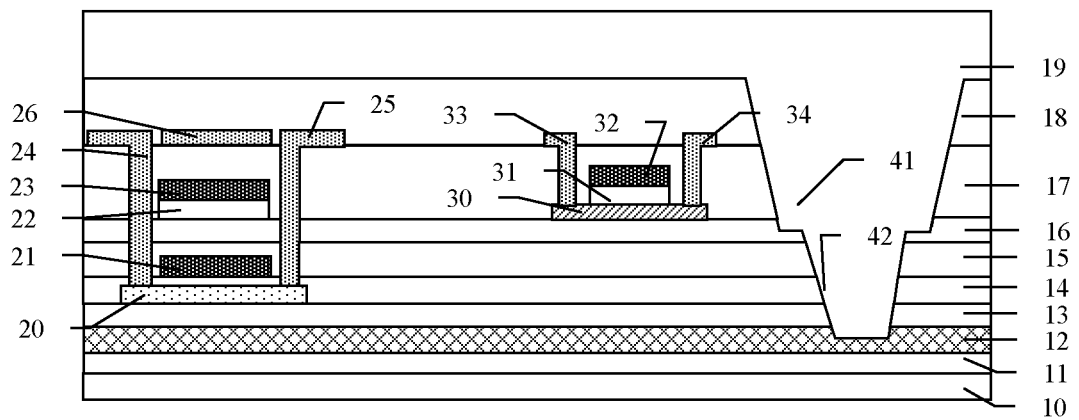
FIG. 1A is a schematic partial cross-sectional view of a low temperature polysilicon-metal oxide organic light emitting diode.

FIG. 1A is a schematic partial cross-sectional view of a low-temperature polysilicon-metal oxide organic light emitting diode (LTPO OLED) in the preparation process. As shown in FIG. 1A, the full screen of the low-temperature polysilicon-metal oxide organic light emitting diode in the preparation process includes a rigid substrate 10 (e.g., glass, plastic, etc.); an organic film layer (e.g., PI layer) 11 on the rigid substrate 10, which is a flexible film layer to serve as a substrate for an organic light emitting diode (LTPO OLED) display screen (the rigid substrate 10 will be peeled off to leave the PI layer as a flexible substrate in a subsequent process); a barrier layer 12 on the organic film layer 11, the barrier layer 12 being used to block the influence of water vapor and impurity ions (e.g., excessive H+ etc.) in the PI layer on the subsequently formed first active layer 20 (polysilicon active layer); a first Buffer layer 13 on the barrier layer 12, the first buffer layer 13 serving to further block water vapor and impurity ions in the PI layer, and serving to add hydrogen ions to the first active layer 20 formed subsequently; a first thin film transistor on the first buffer layer 13, the first thin film transistor including a first active layer 20 made of polysilicon (P—Si) material, a first gate insulating layer (GI layer) 14 on the first active layer 20, a first gate 21 on the first gate insulating layer 14, and a first source electrode 24 and a first drain electrode 25; a first interlayer dielectric layer (ILD layer) 15 on the first gate 21; a second buffer layer 16 on the first interlayer dielectric layer 15, the second buffer layer 16 being used to prevent impurity ions such as hydrogen ions from affecting the second active layer 30 (metal oxide active layer) formed subsequently; a second thin film transistor on the second buffer layer 16, which comprises a second active layer 30 made of indium gallium zinc oxide (IGZO) material, a second gate insulating layer 31 and a second gate 32, a second source electrode 33 and a second drain electrode 34, which are sequentially located on the second active layer 30; a second interlayer dielectric layer 17 on the second gate 32; a passivation layer (PVX layer) 18 on the second interlayer dielectric layer 17; and a planarization lay (PLN layer) 19 locate on the passivation layer 18. When manufacturing the LTPO OLED as shown in FIG. 1A, mask plates for preparing the first active layer 20, the first grid electrode 21, the second active layer 30, the second grid electrode 32, the first edge bending groove 41, the second edge bending groove 42, the source and drain electrode via holes, the first source and drain electrodes 24 and 25, the second source electrode and drain electrodes 33 and 34, the planarization layer 19, and etc. are required, respectively. On the basis of preparing a thin film transistor using a low-temperature polysilicon material, the patterning processes for preparing the second active layer, the second gate electrode, the first edge bending groove (EB1), the second edge bending groove (EB2), the source-drain electrode via hole, the first source and drain electrodes and the second source and drain electrodes are key processes affecting the characteristics of the low-temperature polysilicon-metal oxide organic light emitting diode full screen.

Figure 1B:
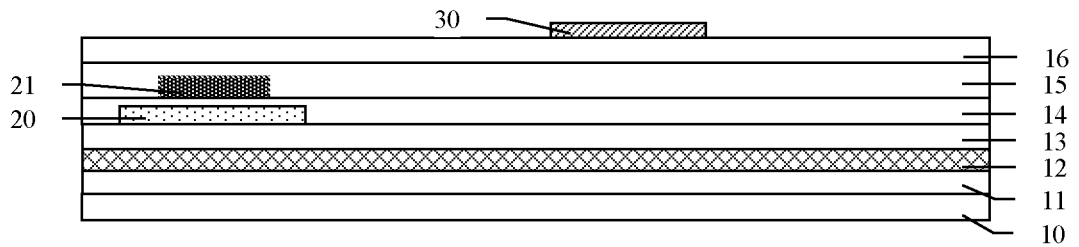
FIGS. 1B-1G are schematic diagrams of a preparation process for preparing the low-temperature polysilicon-metal oxide organic light emitting diode full screen shown in FIG. 1A.

FIGS. 1B-1G are schematic diagrams of a preparation process for preparing the low-temperature polysilicon-metal oxide organic light emitting diode full screen shown in FIG. 1A. As shown in FIG. 1B, an organic film layer 11, a barrier layer 12 and a first buffer layer 13 are sequentially formed on a rigid substrate 10, and a first active layer 20, a first gate electrode 21 and a second active layer 30 are sequentially formed on the side of the first buffer layer 13 away from the rigid substrate 10 by three patterning processes.

Figure 1C:
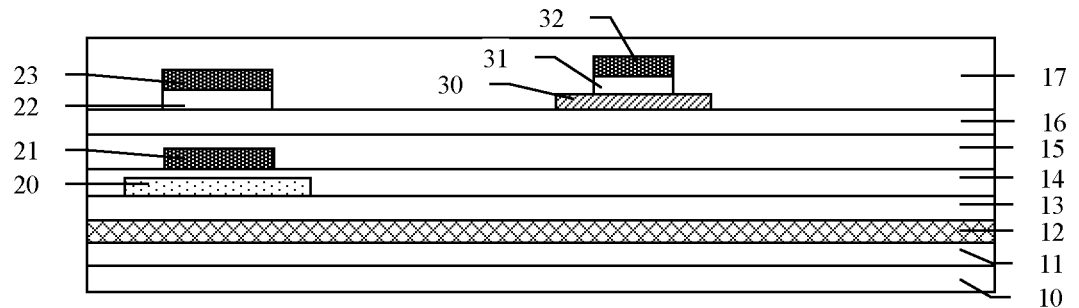

As shown in FIG. 1C, the laminated layer of a second gate insulating layer 31 and the second gate 32 located on the second active layer 30 and the laminated layer of the insulating layer pattern 22 and the first metal pattern 23 located on the side of the first gate electrode 21 away from the first active layer 20 are formed by using the same patterning process, that is, the second gate insulating layer 31 and the insulating layer pattern 22 are formed by patterning from the same insulating film layer, and the second gate electrode 32 and the first metal pattern 23 are formed by patterning from the same first metal layer.

Figure 1D:
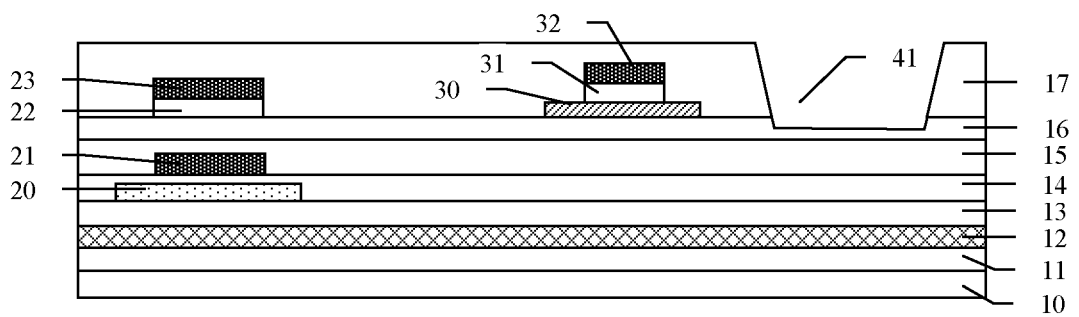
Figure 1E:
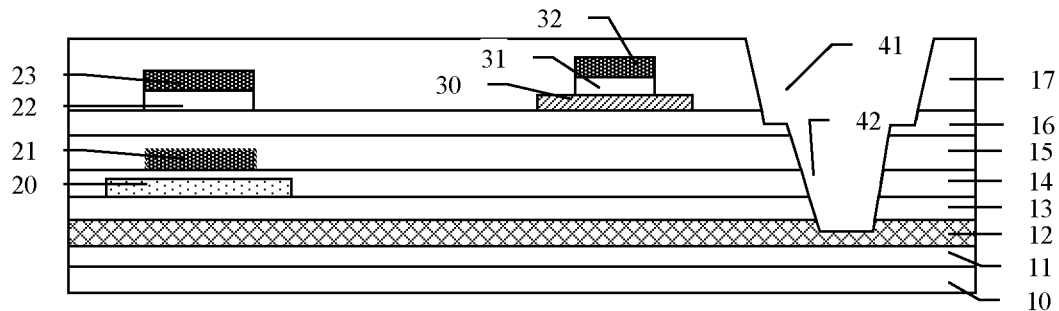

As shown in FIGS. 1D and 1E, since the thickness of the multilayer insulating layer is relatively thick, two patterning processes are required to etch to sequentially form a first edge bending groove 41 and a second edge bending groove 42. The first edge bending groove 41 and the second edge bending groove 42 form a stepped groove structure, and the area of the bottom surface of the first edge bending groove 41 parallel to the plane of the rigid substrate 10 is larger than the area of the bottom surface of the second edge bending groove 42 parallel to the plane of the rigid substrate 10.

Figure 1F:
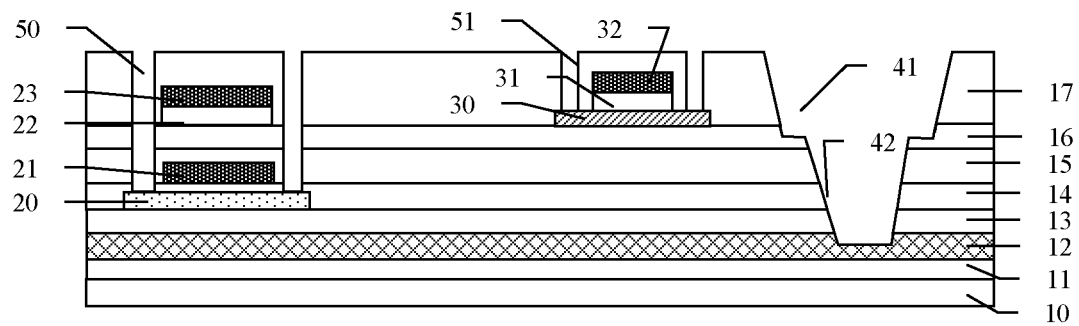
Figure 1G:
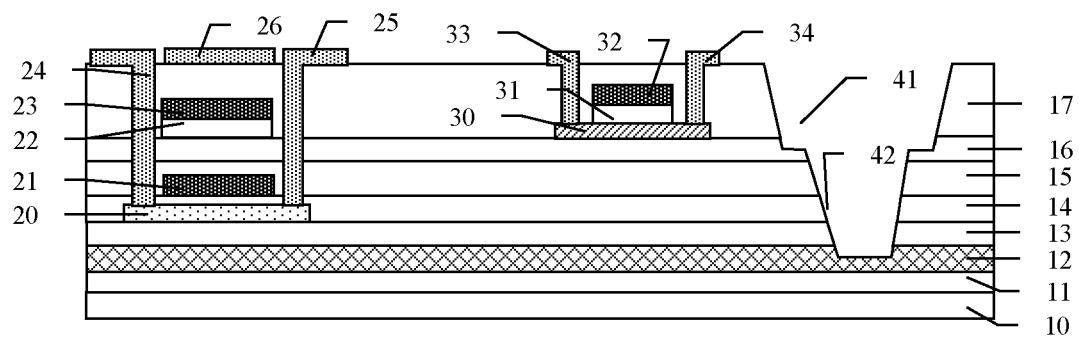

As shown in FIG. 1F, a first via hole 50 configured to expose the first active layer 20 and a second via hole 51 configured to expose the second active layer 30 are formed using one patterning process for the multilayer insulating layer located on the first active layer 20 and the second active layer 30.

As shown in FIGS. 1F and 1Q a second metal layer is formed on the second interlayer dielectric layer 17 and patterned to form a first source electrode 24, a first drain electrode 25, a second source electrode 33, a second drain electrode 34, and a second metal pattern 26. The first source electrode 24 and the first drain electrode 25 are electrically connected to the first active layer 20 through a first via hole 50, and the second source electrode 33 and the second drain electrode 34 are electrically connected to the second active layer 30 through a second via hole 51.

In the process of combining the thin film transistor made of low-temperature polysilicon material and the thin film transistor made of metal oxide material to form a full-screen frame-free display product, there is a problem that the manufacturing processes of the two thin film transistors are incompatible, and the specific problems are as follows.

In the above-described process of etching the multilayer insulating layer to form the first via hole 50 and the second via hole 51, since the thickness of the multi-layer insulating layer on the side of the first active layer 20 away from the rigid substrate 10 is larger than the thickness of the multi-layer insulating layer on the side of the second active layer 30 away from the rigid substrate 10, when the second via hole 51 located in the second active layer 30 just exposes the second active layer 30, a portion of the insulating layer located on the first active layer 20 has not been etched, that is, the first via hole 50 for exposing the first active layer 20 has not been completely etched. After the second via hole 51 on the second active layer 30 has exposed the second active layer 30, it is necessary to continue etching the insulating layer on the first active layer 20 to form the first via hole 50 exposing the first active layer 20. In the process of etching to form the first via hole 50, the portion of the second active layer 30 that has been exposed by the second via hole 51 is damaged due to the influence of etching, resulting in poor etching and further affecting the characteristics of the second thin film transistor.

Since the thickness of the insulating layer on the first active layer 20 where the first via hole 50 is to be formed is relatively thick, the line width deviation of the formed first via hole 50 may be relatively large during etching of the thick insulating layer, which is not conducive to layout design.

After the first via hole 50 is formed, the exposed first active layer 20 needs to be annealed at a high temperature (e.g., a temperature above 350° C.) to add hydrogen ions to the first active layer 20 (polysilicon active layer), thereby making the characteristics of the first thin film transistor (LTPS TFT) more stable. During high temperature annealing, the exposed portion of the second active layer 30 is also affected, thus severely affecting the performance of the second thin film transistor.

After the first via hole 50 is formed, a portion of the first active layer 20 is directly exposed to the environment (e.g., air). Silicon in the first active layer 20 will react with oxygen, resulting in the formation of a SiOx oxide layer (e.g., silicon dioxide) on the surface of the first active layer 20. This oxide layer will affect the contact resistance of the first active layer 20 with the first source electrode 24 and the first drain electrode 25. Therefore, it may need to remove the surface oxide layer from the exposed first active layer 20, for example, performing a HF clean on the exposed surface of the first active layer 20, so that the surface of the first active layer 20 can form good ohmic contact with the subsequently formed first source electrode 24 and first drain electrode 25. The cleaning process will corrode the exposed portion of the second active layer 30, affecting the contact characteristics of the second active layer 30 with the second source electrode 33 and the second drain electrode 34, and further affecting the characteristics of the second thin film transistor.

In the structure shown in FIG. 1A, a capacitor is formed by the first gate electrode 21 and the first metal pattern 23 to compensate the threshold voltage (DTFT Vth) of the drive transistor. Since the first interlayer dielectric layer 15, the second buffer layer 16, and the insulating layer pattern 22 are included between the first gate electrode 21 and the first metal pattern 23, the total thickness of the three insulating layers exceeds 4000 angstroms, i.e., the thickness of the insulating layer between the first gate electrode 21 and the first metal pattern 23 is too large, the capacitance of the pixel circuit will be smaller (the capacitance value is better when the thickness of the insulating layer between the two metal plates constituting the capacitor in the organic light emitting diode is 1000-1500 angstroms), so that its compensation ability to the threshold voltage of the driving transistor will be reduced, thus affecting the uniformity of the display screen. In addition, a second interlayer dielectric layer 17 is included between the first metal pattern 23 and the second metal pattern 26, and its thickness exceeds 3000 angstroms. The passivation layer 18 is included between the second metal pattern 26 and the third metal pattern (not shown in the figure), and its thickness also exceeds 3000 angstroms. Therefore, the capacitor formed by the first metal pattern 23 and the second metal pattern 26, and the capacitor formed by the second metal pattern 26 and the third metal pattern and the capacitor formed by the first grid 21 and the first metal pattern 23 are connected in parallel to form a capacitor which cannot satisfy its compensation capability for the threshold voltage of the drive transistor.

The embodiment of the disclosure provides an array substrate, a manufacturing method thereof and an organic light emitting diode display device. The manufacturing method of the array substrate comprises the following steps: forming a first thin film transistor including a first semiconductor pattern on a substrate, wherein forming the first thin film transistor comprises forming a first electrode pattern including a first source electrode and a first drain electrode and a second electrode pattern including a first auxiliary source electrode and a first auxiliary drain electrode respectively through two patterning processes; forming a second thin film transistor on the substrate, wherein forming the second thin film transistor comprises forming a second source electrode and a second drain electrode through one patterning process, wherein the second electrode pattern, the second source electrode and the second drain electrode are formed in the same patterning process, the first electrode pattern is connected with the first semiconductor pattern, the first auxiliary source electrode is electrically connected with the first source electrode, and the first auxiliary drain electrode is electrically connected with the first drain electrode. The manufacturing method of the array substrate can effectively solve the manufacturing process compatibility problem of the thin film transistor adopting the low-temperature polysilicon material and the thin film transistor adopting the metal oxide material to ensure the process stability.

The array substrate, the manufacturing method thereof and the organic light emitting diode display device provided by the embodiment of the present disclosure will be described below with reference to the accompanying drawings.

An embodiment of the present disclosure provides a manufacturing method of an array substrate. FIG. 2 is a schematic flow chart of the manufacturing method of the array substrate provided in an embodiment of the present disclosure. FIGS. 3A-3L are schematic flow charts of the manufacturing process of the array substrate provided in an embodiment of the present disclosure. As shown in FIG. 2, the manufacturing method includes the following steps.

S101: Forming a first thin film transistor including a first semiconductor pattern on a substrate, forming the first thin film transistor includes forming a first electrode pattern including a first source electrode and a first drain electrode and a second electrode pattern including a first auxiliary source electrode and a first auxiliary drain electrode respectively through two patterning processes.

S102: forming a second thin film transistor on the substrate, wherein forming the second thin film transistor comprises forming a second source electrode and a second drain electrode through one patterning process, wherein the second electrode pattern (including the first auxiliary source electrode and the first auxiliary drain electrode), the second source electrode and the second drain electrode are formed in the same patterning process; the first electrode pattern is connected with the first semiconductor pattern, the first auxiliary source electrode is electrically connected with the first source electrode, and the first auxiliary drain electrode is electrically connected with the first drain electrode.

According to the manufacturing method of the array substrate provided by the embodiment of the disclosure, in the process of forming the first electrode pattern of the first thin film transistor, that is, in the process of forming the first source electrode and the first drain electrode connected with the first semiconductor pattern, the processing process (e.g., annealing process and/or cleaning process) performed on the first semiconductor pattern will not adversely affect the second semiconductor of the second thin film transistor, so that the compatibility of manufacturing processes using different types of thin film transistors can be improved, the electrical characteristics of the second thin film transistor can be improved, and the overall stability of the array substrate can be improved. For example, in the process of forming a polysilicon thin film transistor, the insulating layer of the polysilicon pattern needs to be perforated first, and then the exposed polysilicon pattern needs to be annealed and/or cleaned. The annealing process and/or the cleaning process may cause corrosion and other adverse effects on the oxide pattern of the multi-oxide thin film transistor.

On the other hand, the manufacturing method of the array substrate provided by the embodiment of the disclosure can solve the problems of poor etching, large line width deviation and the like caused by different lengths of the two via holes by adding the step of forming the second electrode pattern so as not to respectively form two via holes exposing the first semiconductor pattern and the second semiconductor pattern at one time.

For example, the sum of the lengths of the first source electrode and the first auxiliary source electrode in the direction perpendicular to the substrate is greater than the length of the second source electrode in the direction perpendicular to the substrate, and/or the sum of the lengths of the first drain electrode and the first auxiliary drain electrode in the direction perpendicular to the substrate is greater than the length of the second drain electrode in the direction perpendicular to the substrate. For example, as shown in FIG. 3A, forming the first thin film transistor 1100 further includes forming a first semiconductor pattern 110 on the substrate 102 and forming a first insulating layer 120 on the first semiconductor pattern 110 before forming the first source electrode and the first drain electrode.

For example, as shown in FIG. 3A, before forming the first semiconductor pattern 110, a substrate 102, a barrier layer 400, and a first buffer layer 103 are sequentially formed on the rigid substrate 100.

For example, as shown in FIG. 3A, the substrate 102 may be a polyimide layer (PI layer), and the substrate 102 is a flexible film layer, such as a PI layer (the rigid substrate 100 will be peeled off to leave the PI layer as the flexible substrate 102 in a subsequent process).

For example, as shown in FIG. 3A, a first semiconductor layer is formed on the first buffer layer 103, and a first semiconductor pattern 110 is formed on the first semiconductor layer by one patterning process.

For example, the material of the first semiconductor pattern 110 is polysilicon.

For example, as shown in FIG. 3A, the first insulating layer 120 formed on the first semiconductor pattern 110 may include a multi-layer insulating layer.

For example, the first insulating layer 120 may include one or more selected from the group consisting of a gate insulating layer, an interlayer dielectric layer, and a second buffer layer.

For example, in the process of forming the first insulating layer 120 including the multi-layer insulating layer, the manufacturing method further includes forming the first gate electrode 101 on the side of the first semiconductor pattern 110 away from the substrate 102 by one patterning process, and a layer of gate insulating layer is included between the first gate electrode 101 and the first semiconductor pattern 110.

For example, as shown in FIG. 3B, a first via hole 121 is formed in the first insulating layer 120 to expose the first semiconductor pattern 110.

For example, as shown in FIG. 3B, a first via hole 121 configured to expose the first semiconductor pattern 110 and a first groove 122 configured to expose the barrier layer 400 may be formed using the same patterning process.

For example, the present embodiment is described with the example that the first groove 122 is configured to expose the barrier layer 400 located in the bending region 401. For example, the bending region 401 may be a pad region of a non-display region of the array substrate, but is not limited thereto, and the bending region 401 may also be located in the display region. It is understood that the first groove 122 may be located in an area adjacent to the first thin film transistor and the second thin film transistor in the display area or in a peripheral area surrounding the display area.

The first groove and the first via hole in this embodiment are formed by the same step patterning process, which can save process steps.

For example, after forming the first via hole 121 in the first insulating layer 120 to expose a portion of the first semiconductor pattern 110, performing high temperature annealing on the exposed portion of the first semiconductor pattern 110 and/or removing an oxide layer on the surface of the first semiconductor pattern 110.

For example, hydrofluoric acid cleaning is performed on the exposed surface of the first semiconductor pattern 110, so that the surface of the first semiconductor pattern 110 can form good ohmic contact with the subsequently formed first source electrode and first drain electrode.

Figure 3C:
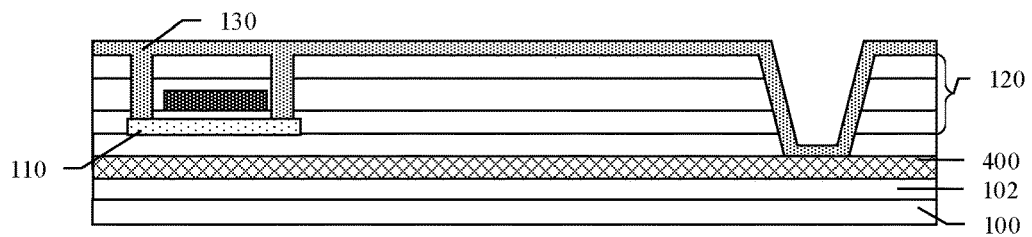

For example, as shown in FIG. 3C, a first metal layer 130 is formed on the first insulating layer 120.

Figure 3D:
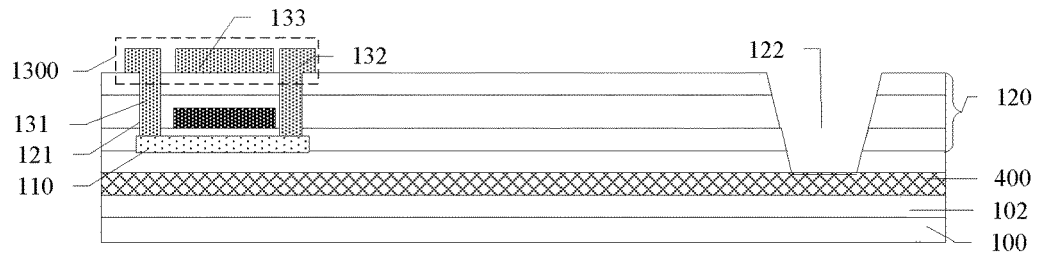

For example, as shown in FIG. 3D, the first metal layer 130 is patterned to form a first electrode pattern 1300 including a first source electrode 131 and a first drain electrode 132, wherein the first source electrode 131 and the first drain electrode 132 are electrically connected to the first semiconductor pattern 110 through first via holes 121, respectively.

For example, as shown in FIGS. 3C and 3D, the first source electrode 131, the first drain electrode 132, and the first metal pattern 133 are formed on the first insulating layer 120 and a part of the barrier layer 400 through the same step patterning process, that is, the first electrode pattern 1300 includes the first metal pattern 133, and the first source electrode 131 and the first drain electrode 132 are electrically connected to the first semiconductor pattern 110 through the first via hole, respectively.

For example, as shown in FIG. 3D, the orthogonal projection of the first metal pattern 133 on the substrate 102 overlaps with the orthogonal projection of the first semiconductor pattern 110 on the substrate 102.

Figure 3E:
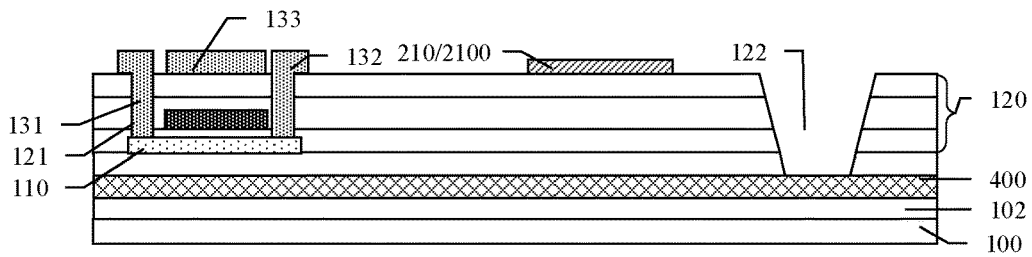

For example, as shown in FIG. 3E, forming the second thin film transistor 2100 includes forming the second semiconductor pattern 210, the orthogonal projection of the first semiconductor pattern 110 on the substrate 102 and the orthogonal projection of the second semiconductor pattern 210 on the substrate 102 do not overlap.

For example, the material of the first semiconductor pattern 110 is different from that of the second semiconductor pattern 210, and the process temperature required for forming the first semiconductor pattern 110 is higher than the process temperature required for forming the second semiconductor pattern 210.

For example, the material of the second semiconductor pattern 210 is a metal oxide such as indium gallium zinc oxide (IGZO).

For example, as shown in FIG. 3E, the second semiconductor pattern 210 and the first metal pattern 133 are formed on the same layer, that is, on the surface of the first insulating layer 120 on the side away from the substrate 102.

In this embodiment, the first semiconductor pattern is the active layer of the polysilicon thin film transistor, the second semiconductor pattern is the active layer of the metal oxide thin film transistor, and the second semiconductor pattern is located on the side of the first semiconductor pattern away from the substrate. According to this embodiment, before forming the second semiconductor pattern, the active layer of the thin film transistor using the polysilicon material is subjected to a high-temperature annealing and/or a treatment process of removing the oxide layer on the surface of the active layer, so that the treatment process can be effectively prevented from affecting the characteristics of the thin film transistor using the metal oxide material.

In this embodiment, the first via hole 121 for exposing the first semiconductor pattern 110 is formed by etching the first insulating layer 120, and the thickness of the first insulating layer 120 is thinner than that of the insulating layer to be formed with the first via hole 50 shown in FIG. 1A. Therefore, this embodiment does not cause a large line width deviation of the formed first via hole 121 during etching the first insulating layer 120 with the smaller thickness, thereby significantly reducing etching difficulty.

Figure 3F:
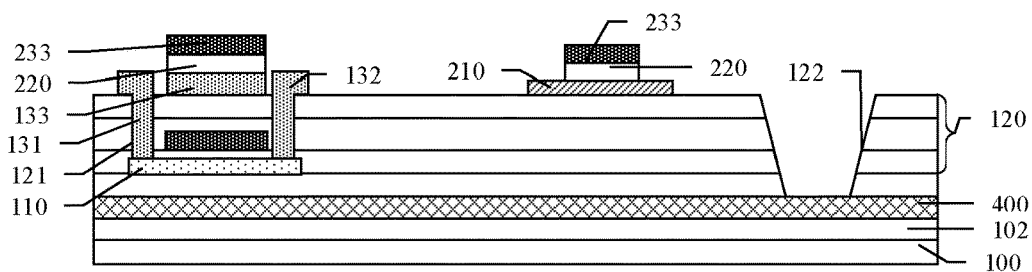
Figure 3G:
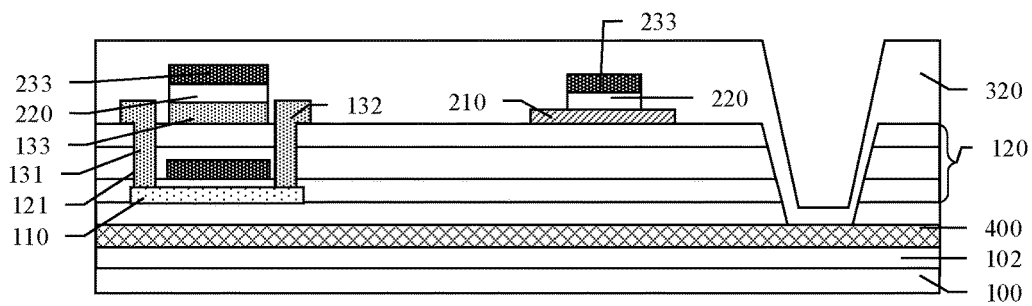

For example, as shown in FIG. 3F, a laminated structure of a second insulating pattern 220 and a second metal pattern 233 are respectively formed on the first metal pattern 133 and the second semiconductor pattern 210 by the same patterning process on the array substrate on which the second semiconductor pattern 210 is formed, and the second insulating pattern 220 is located on the side of the second metal pattern 233 facing the substrate 102.

It should be noted that the second metal pattern 233 on the second semiconductor pattern 210 is the gate of the second thin film transistor using a metal oxide material, and the second insulating pattern 220 is the gate insulating layer of the second thin film transistor using the metal oxide material.

For example, as shown in FIG. 3F, the array substrate formed in this embodiment is an organic light emitting diode array substrate. The orthogonal projection of the second metal pattern 233 on the substrate 102 overlaps with the orthogonal projection of the first metal pattern 133 on the substrate 102, and the distance between the first metal pattern 133 and the second metal pattern 233 is 1000-1500 angstroms. The first metal pattern and the second metal pattern in this embodiment are respectively used as the two metal plates of the capacitor in the organic light emitting diode pixel circuit. Since the thickness of the second insulating pattern in the direction perpendicular to the substrate is 1000-1500 angstroms, the capacitance formed by the two metal plates is relatively large, which can meet the compensation requirement for the threshold voltage of the driving transistor (DTFT Vth).

For example, the distance between the first metal pattern 133 and the second metal pattern 233 is 1000 to 1200 angstroms. For example, the distance between the first metal pattern 133 and the second metal pattern 233 is 1300 to 1400 angstroms.

For example, as shown in FIG. 3Q a third insulating layer 320 is formed on the array substrate on which the second metal pattern 233 is formed. For example, the third insulating layer 320 may be a second interlayer dielectric layer.

Figure 3H:
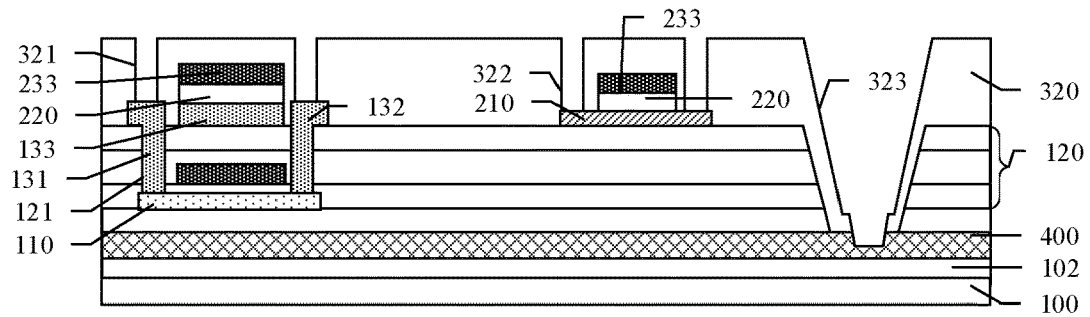

For example, as shown in FIG. 3H, the third insulating layer 320 is patterned by the same patterning process to form the second via hole 321, the third via hole 322, and the second groove 323. The second via hole 321 is configured to expose the first source electrode 131 and the first drain electrode 132, and the third via hole 322 is configured to expose the second semiconductor pattern 210.

For example, in an example, as shown in FIG. 3H, forming the second groove 323 includes etching the third insulating layer 320 located in the first groove and the barrier layer 400 with a partial thickness to expose the barrier layer 400. Here, in a direction perpendicular to the substrate 102, a portion of the barrier layer 400 located in the second groove 323 is etched away relative to the barrier layer 400 located in other positions, and the remaining thickness of the barrier layer 400 located in the second groove 323 is approximately 1000-2000 angstroms.

Figure 3I:
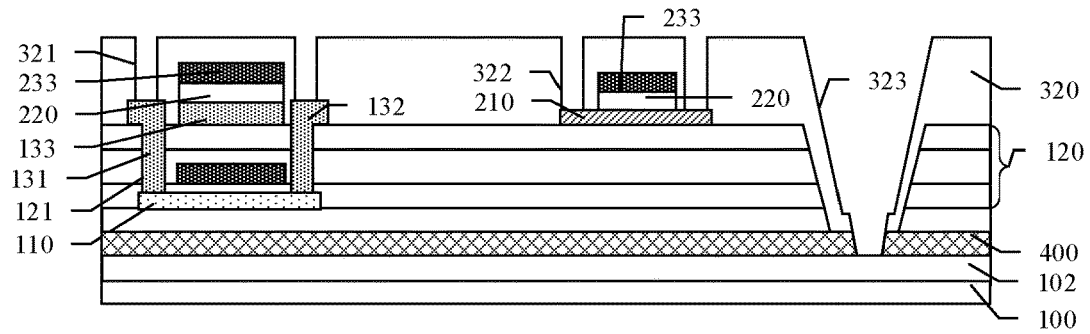

For example, in another example, as shown in FIG. 3I, forming the second groove 323 includes etching the third insulating layer 320 and the barrier layer 400 located in the first groove to expose the substrate 102.

Figure 3J:
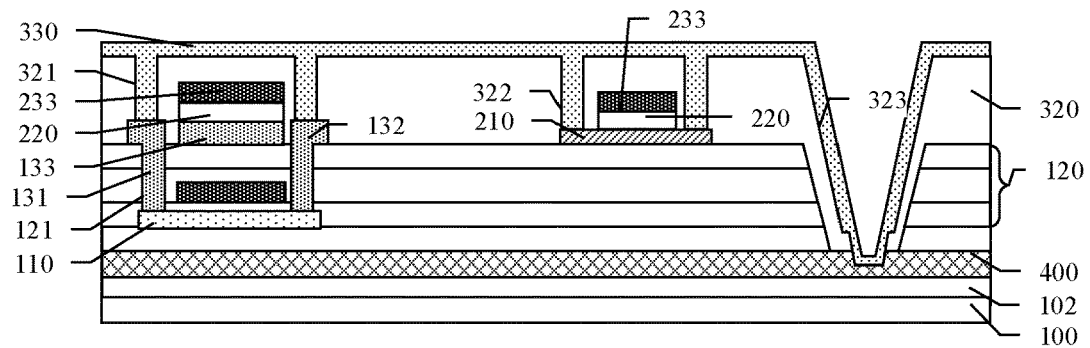
Figure 3K:
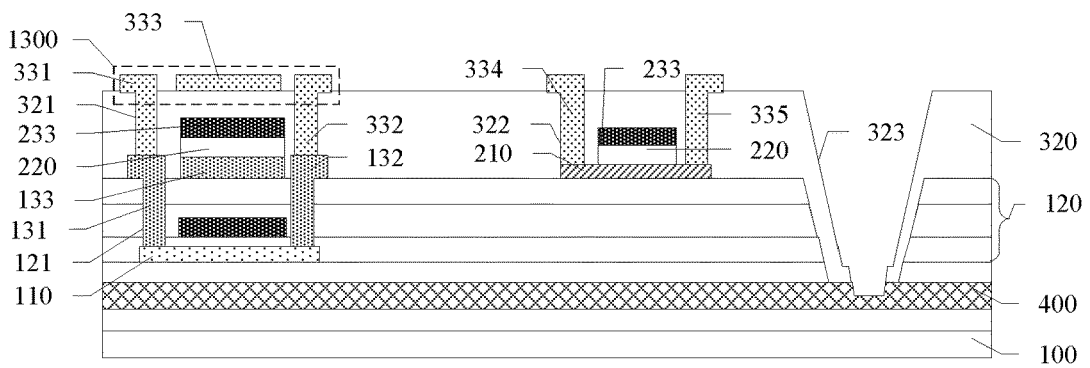

For example, as shown in FIGS. 3J and 3K, a third metal layer 330 is formed on the third insulating layer 320 and a portion of the barrier layer 400, and the third metal layer 330 is patterned in the same patterning process to form a second electrode pattern 3300 including a first auxiliary source electrode 331 and a first auxiliary drain electrode 332, a second source electrode 334, and a second drain electrode 335. The first auxiliary source electrode 331 and the first auxiliary drain electrode 332 are electrically connected to the first source electrode 131 and the first drain electrode 132 through the second via hole 321, respectively, and the second source electrode 334 and the second drain electrode 335 are electrically connected to the second semiconductor pattern 210 through the third via hole 322, respectively.

In a thin film transistor made of polysilicon material, a first auxiliary source electrode is electrically connected to the first source electrode as a source electrode of the thin film transistor made of polysilicon material, and a first auxiliary drain electrode is electrically connected to the first drain electrode as a drain electrode of the thin film transistor made of polysilicon material. The first via hole and the second via hole (the source electrode and the drain electrode pass through the first via hole and the second via hole and are electrically connected with the first semiconductor pattern) in the thin film transistor made of polysilicon material are respectively formed through two patterning processes, so that the etching difficulty can be effectively reduced.

For example, as shown in FIG. 3K, simultaneously with patterning the third metal layer to form the first auxiliary source electrode 331, the first auxiliary drain electrode 332, the second source electrode 334, and the second drain electrode 335, forming a third metal pattern 333, the orthogonal projection of the third metal pattern 333 on the substrate 102 overlaps with the orthogonal projection of the second metal pattern 233 on the substrate 102, and therefore, if the capacitor formed by the first metal pattern and the second metal pattern still cannot meet the compensation demand for the threshold voltage of the drive transistor (DTFT Vth), the capacitor formed by the second metal pattern and the third metal pattern may be connected in parallel with the capacitor formed by the first metal pattern and the second metal pattern to increase the magnitude of the capacitance.

Figure 3L:
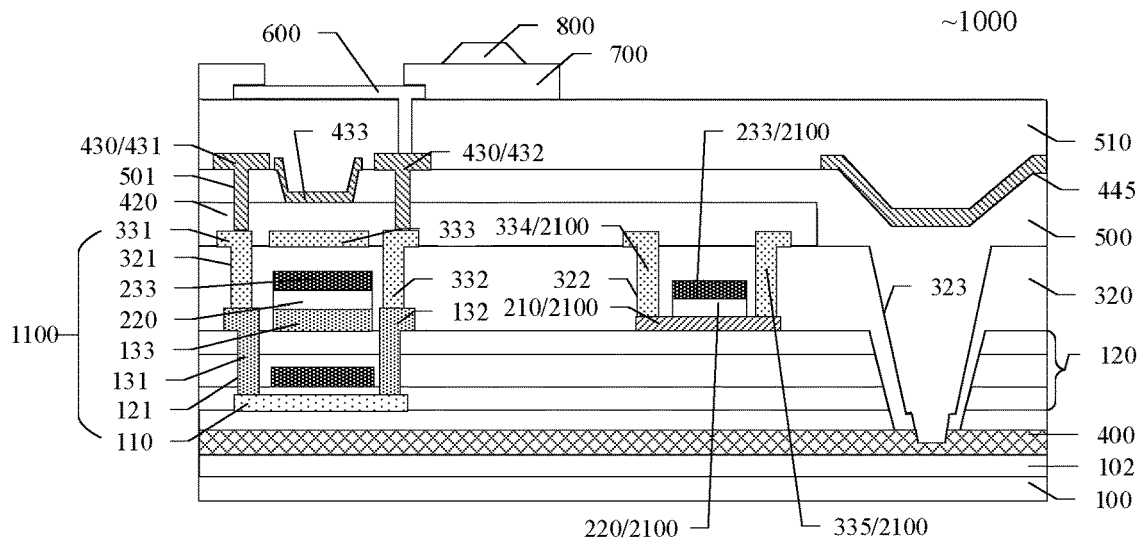

For example, as shown in FIG. 3L, a fourth insulating layer 420 is formed on the array substrate on which the first auxiliary source electrode 331, the first auxiliary drain electrode 332, the second source electrode 334, and the second drain electrode 335 are formed. For example, the fourth insulating layer 420 may be a passivation layer.

For example, as shown in FIG. 3L, the fourth insulating layer 420 is patterned to expose the first auxiliary source electrode 331 and the first auxiliary drain electrode 332.

For example, as shown in FIG. 3L, an organic film layer 500 is formed on an array substrate on which a fourth insulating layer 420 is formed.

For example, as shown in FIG. 3L, if the inorganic insulating layer located in the bending region cannot be etched to achieve the desired etching effect during etching to form the second groove 323, the inorganic insulating layer in the bending region can be etched again by patterning the fourth insulating layer 420 to achieve the required etching effect. The "required etching effect" here refers to the maximum thickness remaining after etching the inorganic film layer located in the bending region is not more than 2000 angstroms, for example, the thickness of the barrier layer 400 located in the bending region is 100-2000 angstroms, and the specific thickness shall be subject to the bending effect that does not affect the bending region; or, the substrate 102 is exposed after etching the inorganic film layer located in the bending region, so that the bending region has good bending performance after the second groove 323 is filled with the organic film layer 500.

For example, as shown in FIG. 3L, a fourth via hole 501 is formed in the organic film layer 500 to expose the first auxiliary source electrode 331 and the first auxiliary drain electrode 332, and then a fourth metal layer 430 is formed on the organic film layer 500 and patterned to form a second auxiliary source electrode 431 and a second auxiliary drain electrode 432 that are connected to the first auxiliary source electrode 331 and the first auxiliary drain electrode 332, respectively, through the fourth via hole 501.

The technology of forming the first auxiliary source-drain electrodes and the second auxiliary source-drain electrodes in this embodiment is called double SD technology. On one hand, by forming the first auxiliary source-drain electrodes and the second auxiliary source-drain electrodes in different layers so that the traces located in the peripheral region are located in different layers, the effect of narrow border can be realized. On the other hand, the second auxiliary source-drain electrodes are electrically connected to the first auxiliary source-drain electrodes through via holes, which can reduce the resistance of the first auxiliary source-drain electrodes.

For example, as shown in FIG. 3L, simultaneously with patterning the fourth metal layer 430 to form the second auxiliary source electrode 431 and the second auxiliary drain electrode 432, it is possible to form a fourth metal pattern 433, the orthogonal projection of the fourth metal pattern 433 on the substrate 102 overlaps with the orthogonal projection of the third metal pattern 333 on the substrate 102, and therefore, if the capacitor formed by the second metal pattern and the third metal pattern connected in parallel with the capacitor formed by the first metal pattern and the second metal pattern still cannot meet the compensation demand for the threshold voltage of the drive transistor (DTFT Vth), the capacitor formed by the third metal pattern and the fourth metal pattern may be connected in parallel with the above-mentioned capacitors to increase the magnitude of the capacitance.

For example, the first metal pattern, the second metal pattern, the third metal pattern, and the fourth metal pattern are electrically connected together through via holes to realize parallel connection of the three capacitors, and the first metal pattern is electrically connected with the first gate electrode, and the second metal pattern is electrically connected with the drain electrode of other thin film transistors not shown in the figure.

For example, as shown in FIG. 3L, while patterning the fourth metal layer 430 to form the fourth metal pattern 433, this embodiment also includes forming a metal trace 445 on the organic film layer 500 located in the bending region, which is used to connect the trace of the display region to the circuit board in the peripheral region.

For example, as shown in FIG. 3L, a planarization layer 510 is formed on the array substrate on which the fourth metal pattern 433 is formed, and a via hole is patterned on the planarization layer 510 to expose the second auxiliary drain electrode 432.

For example, as shown in FIG. 3L, a fifth metal layer is formed on the planarization layer 510 and patterned to form an anode 600 of an organic light emitting diode, and the anode 600 is electrically connected to the second auxiliary drain electrode 432 through a via hole included in the planarization layer 510.

For example, as shown in FIG. 3L, a pixel defining layer 700 is formed on an array substrate on which an anode 600 is formed.

For example, as shown in FIG. 3L, a barrier wall 800 is formed on the pixel defining layer 700.

To sum up, the manufacturing method of the array substrate provided by the embodiment optimizes the processes on the basis of ensuring the effects of the original six patterning processes for preparing the second semiconductor pattern, the second metal pattern, the first groove, the second groove, the via hole and the first metal pattern, and solves the problem that the characteristics of the thin film transistor using metal oxide are affected due to incompatibility of the process processes of the thin film transistor using polysilicon and the thin film transistor using metal oxide; and the thickness of the insulating layer between the first metal pattern and the second metal pattern is reduced, the magnitude of the capacitance is increased, and the compensation capability of the capacitor to the threshold voltage of the driving transistor is improved, thereby improving the uniformity of the display picture.

Figure 4:
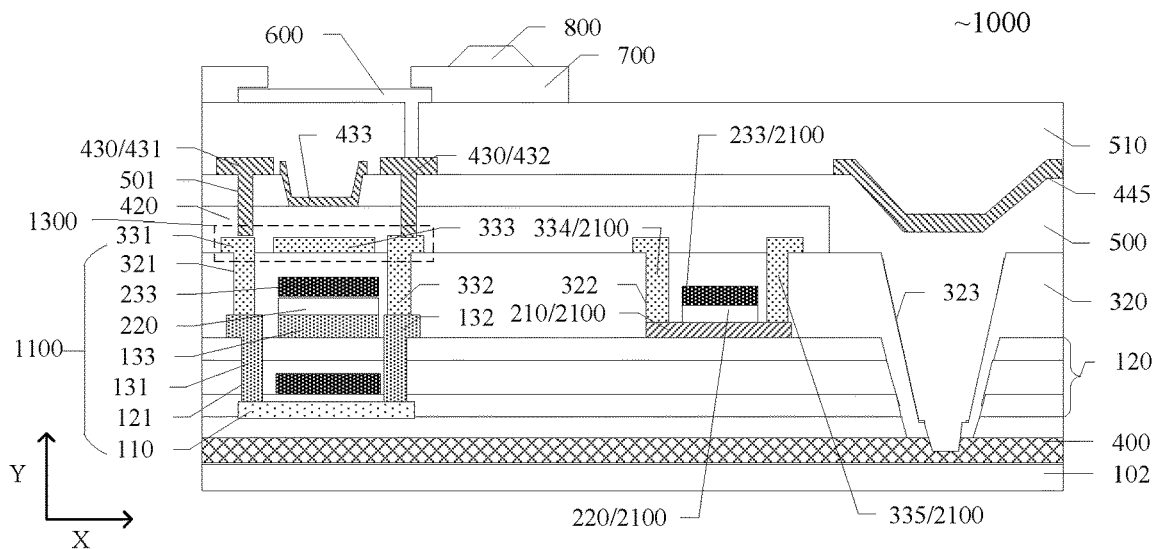
FIG. 4 is a schematic diagram of an array substrate according to an embodiment of the present disclosure.

Another embodiment of the present disclosure provides an array substrate. FIG. 4 shows a partial cross-sectional view of the array substrate provided in this embodiment. As shown in FIG. 4, the array substrate 1000 includes a substrate 102; a first thin film transistor 1100 on the substrate 102, the first thin film transistor 1100 including a first semiconductor pattern 110, a first electrode pattern 1300 including a first source electrode 131 and a first drain electrode 132, and a second electrode pattern 3300 including a first auxiliary source electrode 331 and a first auxiliary drain electrode 332; a second thin film transistor 2100 on the substrate 102, the second thin film transistor 2100 including a second source electrode 334 and a second drain electrode 335. The first auxiliary source electrode 331 is electrically connected to the first source electrode 131, and the first auxiliary drain electrode 332 is electrically connected to the first drain electrode 132.

For example, the sum of the lengths of the first source electrode 131 and the first auxiliary source electrode 331 in the direction perpendicular to the substrate 102 (Y direction shown in the figure) is greater than the length of the second source electrode 334 in the direction perpendicular to the substrate 102, and/or the sum of the lengths of the first drain electrode 132 and the first auxiliary drain electrode 332 in the direction perpendicular to the substrate 102 is greater than the length of the second drain electrode 335 in the direction perpendicular to the substrate 102.

For example, as shown in FIG. 4, the array substrate 1000 further includes a first semiconductor pattern 110 on the substrate 102; a first insulating layer 120 on a side of the first semiconductor pattern 110 away from the substrate 102, the first insulating layer 120 including a first via hole 121; a first source electrode 131 and a first drain electrode 132 on the first insulating layer 120 being electrically connected to the first semiconductor pattern 110 through the first via hole 121, respectively; and a second semiconductor pattern 210 located on the surface of the first insulating layer 120. The orthogonal projection of the first semiconductor pattern 110 on the substrate 102 does not overlap with the orthogonal projection of the second semiconductor pattern 210 on the substrate 102.

For example, as shown in FIG. 4, the array substrate 1000 provided in this embodiment further includes a first metal pattern 133 located on the surface of the first insulating layer 120 on the side away from the substrate 102, and the second semiconductor pattern 210 is located on the same layer as the first metal pattern 133.

For example, the material of the first semiconductor pattern 110 is different from that of the second semiconductor pattern 210, and the process temperature required for forming the first semiconductor pattern 110 is higher than the process temperature required for forming the second semiconductor pattern 210.

For example, the material of the first semiconductor pattern 110 is polysilicon, and the material of the second semiconductor pattern 210 is metal oxide, such as indium gallium zinc oxide (IGZO).

In this embodiment, the first semiconductor pattern is the active layer of the polysilicon thin film transistor, the second semiconductor pattern is the active layer of the metal oxide thin film transistor, and the second semiconductor pattern is located on the side of the first semiconductor pattern away from the substrate. In this embodiment, the active layer of the thin film transistor made of polysilicon material is processed before forming the second semiconductor pattern, which can effectively prevent the processing process from affecting the characteristics of the thin film transistor made of metal oxide material. The array substrate in this embodiment combines a thin film transistor made of a metal oxide material and a thin film transistor made of a polysilicon material, so that the thin film transistors included in the array substrate simultaneously have the advantages of high mobility, fast charging and low leakage current, thereby enabling the display device using the array substrate provided in this embodiment to have excellent user experience.

For example, as shown in FIG. 4, the array substrate 1000 further includes a second insulating pattern 220 located on a side of the first metal pattern 133 away from the substrate 102; a second metal pattern 233 located on the side of the second insulating pattern 220 away from the first metal pattern 133. The orthogonal projection of the second metal pattern 233 on the substrate 102 overlaps with the orthogonal projection of the first metal pattern 133 on the substrate 102, and the distance between the first metal pattern 133 and the second metal pattern 133 is 1000-1500 angstroms. The array substrate provided in this embodiment takes an organic light emitting diode array substrate as an example. The first metal pattern and the second metal pattern in this embodiment are respectively used as the two metal plates of the capacitor in the organic light emitting diode pixel circuit. Since the thickness of the second insulating pattern in the direction perpendicular to the substrate is 1000-1500 angstroms, the capacitance formed by the two metal plates is larger, which can meet the compensation requirement for the threshold voltage of the driving transistor (DTFT Vth).

For example, the distance between the first metal pattern 133 and the second metal pattern 233 is 1000 to 1200 angstroms. For example, the distance between the first metal pattern 133 and the second metal pattern 233 is 1300 to 1400 angstroms.

For example, as shown in FIG. 4, the array substrate 1000 further includes a third insulating layer 320 located at a side of the second semiconductor pattern 210 away from the substrate 102, the third insulating layer 320 includes a second via hole 321 and a third via hole 322, the first auxiliary source electrode 331 and the first auxiliary drain electrode 332 are electrically connected to the first source electrode 131 and the first drain electrode 132, respectively, through the second via hole 321, and the second source electrode 334 and the second drain electrode 335 are electrically connected to the second semiconductor pattern 210 through the third via hole 322, respectively.

For example, as shown in FIG. 4, the array substrate 1000 further includes a third metal pattern 333 located on a side of the third insulating layer 320 away from the second metal pattern 210, and the orthogonal projection of the third metal pattern 333 on the substrate 102 overlaps with the orthogonal projection of the second metal pattern 233 on the substrate 102. Therefore, if the capacitance formed by the first metal pattern and the second metal pattern still cannot meet the compensation demand for the threshold voltage of the drive transistor (DTFT Vth), the capacitor formed by the second metal pattern and the third metal pattern may be connected in parallel with the capacitor formed by the first metal pattern and the second metal pattern to increase the magnitude of the capacitance.

For example, as shown in FIG. 4, the array substrate 1000 further includes a fourth insulating layer 420 located on a side of the third metal pattern 333 away from the second metal pattern 233; and a fourth metal pattern 433 located at a side of the fourth insulating layer 420 away from the third metal pattern 333, the orthogonal projection of the fourth metal pattern 433 on the substrate 102 overlaps with the orthogonal projection of the third metal pattern 333 on the substrate 102. Therefore, if the capacitance formed by connecting the capacitor formed by the second metal pattern and the third metal pattern in parallel with the capacitor formed by the first metal pattern and the second metal pattern still cannot meet the compensation demand for the threshold voltage of the drive transistor (DTFT Vth), the capacitor formed by the third metal pattern and the fourth metal pattern may be connected in parallel with the above-mentioned capacitors to increase the magnitude of the capacitance.

For example, as shown in FIG. 4, the array substrate 1000 further includes an organic film layer 500 located on a side of the fourth insulating layer 420 away from the substrate 102, and the fourth via hole 501 included in the organic film layer 500 is configured to expose the first auxiliary source electrode 331 and the first auxiliary drain electrode 332. For example, the array substrate further includes a second auxiliary source electrode 431 and a second auxiliary drain electrode 432 electrically connected to the first auxiliary source electrode 331 and the first auxiliary drain electrode 332, respectively, through the fourth via hole 501.

The combination of the first auxiliary source-drain electrodes and the second auxiliary source-drain electrodes in this embodiment is called double SD technology. On one hand, by forming the first auxiliary source-drain electrodes and the second auxiliary source-drain electrodes in different layers so that the traces located in the peripheral region are located in different layers, the effect of narrow frame can be realized. On the other hand, the second auxiliary source-drain electrodes are electrically connected to the first auxiliary source-drain electrodes through via holes, which can reduce the resistance of the first auxiliary source-drain electrodes.

Figure 5:
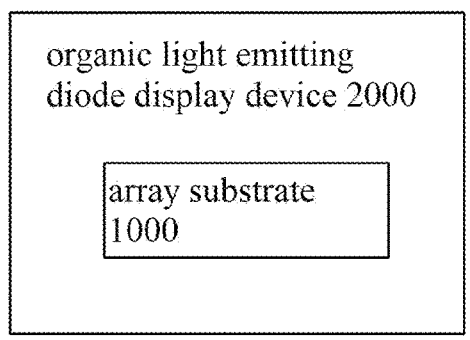
FIG. 5 is a schematic diagram of an organic light emitting diode display device including any one of the above array substrates according to embodiments of the present disclosure.

Another embodiment of the present disclosure provides an organic light emitting diode display device 2000. FIG. 5 is a schematic diagram of an organic light emitting diode display device including any of the above array substrates according to an embodiment of the present disclosure. Since the array substrate combines a thin film transistor made of a metal oxide material and a thin film transistor made of a polycrystalline silicon material, the thin film transistors included in the array substrate have the advantages of high mobility, fast charging and low leakage current at the same time, thereby enabling the display device provided by the embodiment to have excellent user experience.

For example, the organic light emitting diode display device may be any product or component having a display function such as a television, a digital camera, a mobile phone, a watch, a tablet computer, a notebook computer, a navigator and the like including the display device, and the present embodiment is not limited thereto.

The following points need to be explained:

(1) Unless otherwise defined, in the embodiments of the present disclosure and the drawings, the same reference numerals represent the same meaning.

(2) In the drawings of the embodiments of the present disclosure, only the structures related to the embodiments of the present disclosure are involved, and other structures may refer to the common design.

(3) For the sake of clarity, layers or regions are exaggerated in the drawings for describing embodiments of the present disclosure. It will be understood that when an element such as a layer, film, region or substrate is referred to as being "on" or "under" another element, the element may be "directly" on or under the other element, or intervening elements may be present.

The above description is only a specific embodiment of the present disclosure, but the scope of protection of the present disclosure is not limited to this. Any person familiar with the technical field can easily think of changes or substitutions within the technical scope of the present disclosure, and should be covered within the scope of protection of the present disclosure. Therefore, the scope of protection of the present disclosure should be based on the scope of protection of the claims.

What is claimed is:

1. An organic light emitting diode display device, comprising:
    a substrate;
    a barrier layer, located on a side of the substrate;
    a first buffer layer, located on a side of the barrier layer away from the substrate;
    a first semiconductor layer, located on a side of the first buffer layer away from the substrate;
    a first gate insulating layer, located on a side of the first semiconductor layer away from the substrate;
    a first gate electrode, located on a side of the first gate insulating layer away from the substrate;
    a second buffer layer, located on a side of the first gate electrode away from the substrate;
    a second semiconductor layer, located on a side of the second buffer layer away from the substrate;
    a second gate insulating layer, located on a side of the second semiconductor layer away from the substrate;
    a second gate electrode, located on a side of the second gate insulating layer away from the substrate,
    wherein a material of the first semiconductor layer is different from that of the second semiconductor layer, wherein a thickness of the second gate insulating layer in a direction perpendicular to the substrate is 1000-1500 angstroms,
    the organic light emitting diode display device further comprises a first metal pattern, wherein the first metal pattern is located on a side of the second buffer layer away from the substrate and a side of the second gate insulating layer close to the substrate, an orthographic projection of the second gate electrode on the substrate overlaps with an orthographic projection of the first metal pattern on the substrate, and a distance between the first metal pattern and the second gate electrode is 1000-1500 angstroms.

2. The organic light emitting diode display device of claim 1, further comprising:
    a first electrode pattern, connected with the first semiconductor layer, and
    a second electrode pattern, connected with the first electrode pattern,
    wherein the first electrode pattern comprises a first source electrode and a first drain electrode, the second electrode pattern comprises a first auxiliary source electrode and a first auxiliary drain electrode, the first auxiliary source electrode is electrically connected with the first source electrode, and the first auxiliary drain electrode is electrically connected with the first drain electrode.

3. The organic light emitting diode display device of claim 1, wherein the first metal pattern is located in a same layer as the second semiconductor layer.

4. The organic light emitting diode display device of claim 1, further comprising an interlayer dielectric layer, located on a side of the second gate electrode away from the substrate.

5. The organic light emitting diode display device of claim 1, wherein the distance between the first metal pattern and the second gate electrode is 1300-1400 angstroms.

6. The organic light emitting diode display device of claim 1, wherein the material of the first semiconductor layer comprises polysilicon and the material of the second semiconductor pattern comprises metal oxide.

7. The organic light emitting diode display device of claim 6, wherein the metal oxide comprises indium gallium zinc oxide (IGZO).

8. An organic light emitting diode display device, comprising:
    a substrate;
    a barrier layer, located on a side of the substrate;
    a first buffer layer, located on a side of the barrier layer away from the substrate;
    a first semiconductor layer, located on a side of the first buffer layer away from the substrate;
    a first gate insulating layer, located on a side of the first semiconductor layer away from the substrate;
    a first gate electrode, located on a side of the first gate insulating layer away from the substrate;
    a second buffer layer, located on a side of the first gate electrode away from the substrate;
    a second semiconductor layer, located on a side of the second buffer layer away from the substrate;
    a second gate insulating layer, located on a side of the second semiconductor layer away from the substrate;
    a second gate electrode, located on a side of the second gate insulating layer away from the substrate, wherein a material of the first semiconductor layer is different from that of the second semiconductor layer, and the first gate electrode directly contacts with the first gate insulating layer, a thickness of the second gate insulating layer in a direction perpendicular to the substrate is 1000-1500 angstroms, the organic light emitting diode display device further comprises a first metal pattern, wherein the first metal pattern is located on a side of the second buffer layer away from the substrate and a side of the second gate insulating layer close to the substrate, an orthographic projection of the second gate electrode on the substrate overlaps with an orthographic projection of the first metal pattern on the substrate, and a distance between the first metal pattern and the second gate electrode is 1000-1500 angstroms.

9. The organic light emitting diode display device of claim 8, wherein the first semiconductor layer directly contacts with the first buffer layer, and the second semiconductor layer directly contacts with the second buffer layer.

10. The organic light emitting diode display device of claim 8, wherein the first metal pattern is located in a same layer as the second semiconductor layer.

11. An organic light emitting diode display device, comprising:
- a substrate;
- a barrier layer, located on a side of the substrate;
- a first buffer layer, located on a side of the barrier layer away from the substrate;
- a first semiconductor layer, located on a side of the first buffer layer away from the substrate;
- a first gate insulating layer, located on a side of the first semiconductor layer away from the substrate;
- a first gate electrode, located on a side of the first gate insulating layer away from the substrate;
- a second buffer layer, located on a side of the first gate electrode away from the substrate;
- a second semiconductor layer, located on a side of the second buffer layer away from the substrate;
- a second gate insulating layer, located on a side of the second semiconductor layer away from the substrate;
- a second gate electrode, located on a side of the second gate insulating layer away from the substrate, wherein a material of the first semiconductor layer is different from that of the second semiconductor layer, the organic light emitting diode display device has a display area and a peripheral area, a bending region is provided on a side of the second gate electrode away from the substrate, a metal trace is provided in the bending region, and the metal trace is configured to connect a trace of the display area to the peripheral area, a thickness of the second gate insulating layer in a direction perpendicular to the substrate is 1000-1500 angstroms, the organic light emitting diode display device further comprises a first metal pattern, wherein the first metal pattern is located on a side of the second buffer layer away from the substrate and a side of the second gate insulating layer close to the substrate, an orthographic projection of the second gate electrode on the substrate overlaps with an orthographic projection of the first metal pattern on the substrate, and a distance between the first metal pattern and the second gate electrode is 1000-1500 angstroms.

12. The organic light emitting diode display device of claim 11, further comprising:
- a first electrode pattern, connected with the first semiconductor layer, and
- a second electrode pattern, connected with the first electrode pattern, wherein the first electrode pattern comprises a first source electrode and a first drain electrode, the second electrode pattern comprises a first auxiliary source electrode and a first auxiliary drain electrode, the first auxiliary source electrode is electrically connected with the first source electrode, and the first auxiliary drain electrode is electrically connected with the first drain electrode.

13. The organic light emitting diode display device of claim 12, further comprising a second auxiliary source electrode and a second auxiliary drain electrode, wherein the second auxiliary source electrode and the second auxiliary drain electrode are electrically connected to the first auxiliary source electrode and the first auxiliary drain electrode, respectively.

14. The organic light emitting diode display device of claim 13, wherein the second auxiliary source electrode, the second auxiliary drain electrode and the metal trace are located in a same trace and comprise a same material.

* * * * *